(12) United States Patent
Hirota

(10) Patent No.: US 7,943,520 B2
(45) Date of Patent: May 17, 2011

(54) HOLE PATTERN FORMING METHOD AND SEMICONDUCTOR DEVICE MANUFACTURING METHOD

(75) Inventor: Toshiyuki Hirota, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 422 days.

(21) Appl. No.: 12/246,649

(22) Filed: Oct. 7, 2008

(65) Prior Publication Data

US 2009/0093120 A1    Apr. 9, 2009

(30) Foreign Application Priority Data

Oct. 9, 2007   (JP) ................................ 2007-263401

(51) Int. Cl.
*H01L 21/768* (2006.01)
(52) U.S. Cl. ................. 438/694; 438/717; 257/E21.577
(58) Field of Classification Search .................. 438/694, 438/717; 257/E21.577
See application file for complete search history.

(56) References Cited

U.S. PATENT DOCUMENTS 6,225,184 B1    5/2001   Hayashi et al.

FOREIGN PATENT DOCUMENTS

| JP | 09-045633 | 2/1997 |
|----|-----------|--------|
| JP | 11-261025 | 9/1999 |
| JP | 2007-027180 | 2/2007 |

OTHER PUBLICATIONS

Mamoru Terai et al., Advanced RLACS Technology for ArF Resist, Journal of Photopolymer Science and Technology, vol. 16, No. 4, (2003), p. 507-510.
Takamitsu Furukawa et al., Forming sub-100 nm contact holes, OKI Technical Review, Apr. 2002/Issue 190 vol. 69 No. 2, pp. 58-61.
Dennis Hausmann et al., Rapid Vapor Deposition of Highly Conformal Silica Nanolaminates, Science, vol. 298, Oct. 11, 2002, pp. 402-406.

*Primary Examiner* — Nadine G Norton
*Assistant Examiner* — Mahmoud Dahimene
(74) *Attorney, Agent, or Firm* — Young & Thompson

(57) ABSTRACT

A hole pattern forming method that forms a fine hole pattern in a work target layer that is formed on a semiconductor substrate, includes: forming a three-layer structure by laminating a carbon film layer, an intermediate mask layer, and a photoresist layer in that order on the work target layer; after patterning a hole pattern in the photoresist layer, patterning the hole pattern in the intermediate mask layer with the patterned photoresist layer serving as a mask; forming a sidewall oxide film on exposed portions of the photoresist layer, the intermediate mask layer, and the carbon film layer; forming a sidewall portion that includes the sidewall oxide film on inner wall surfaces of the hole pattern by etching back the sidewall oxide film; and after patterning a fine hole pattern in the carbon film layer with the sidewall portion and the intermediate mask layer serving as a mask, patterning the fine hole pattern in the work target layer with the patterned carbon film layer serving as a mask.

6 Claims, 8 Drawing Sheets

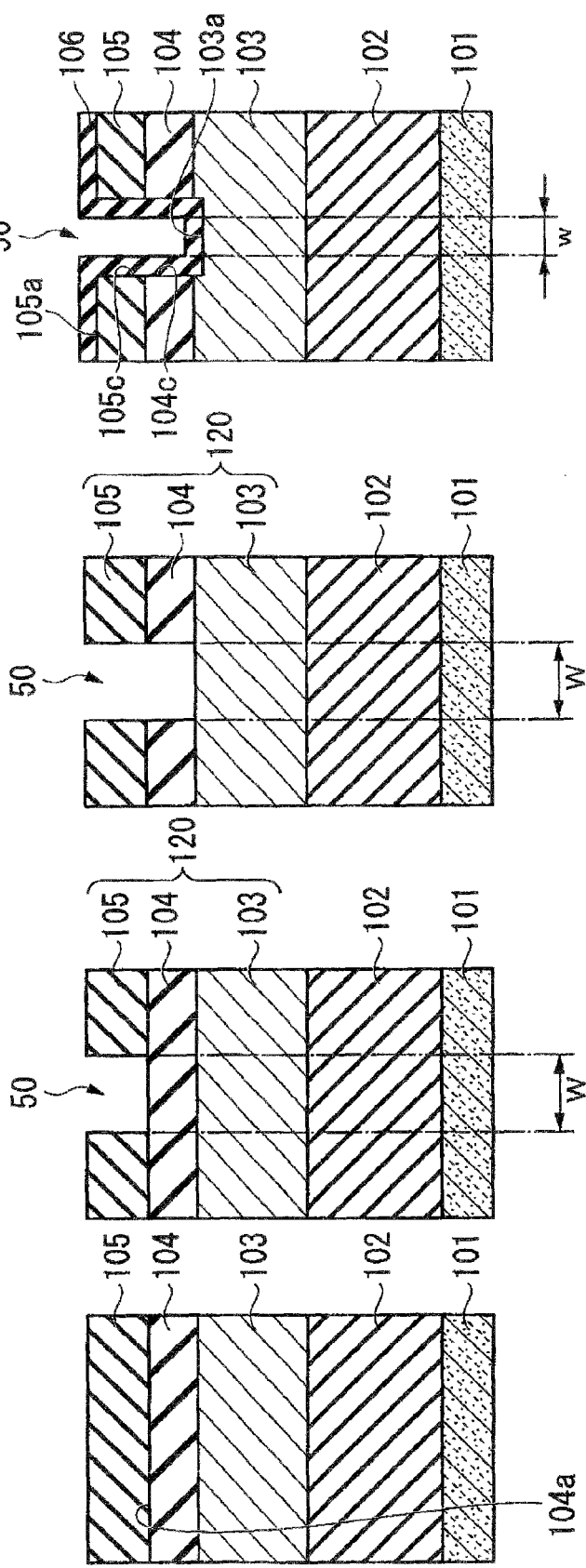

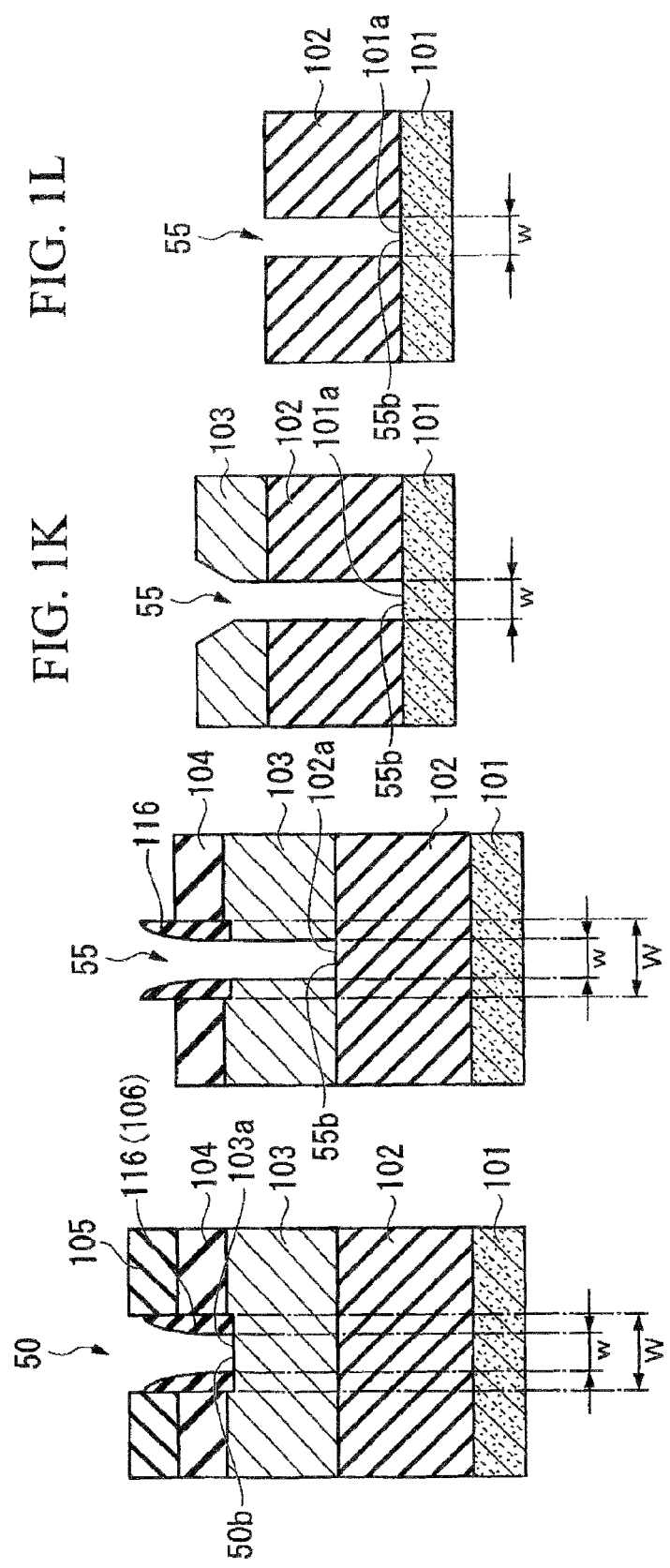

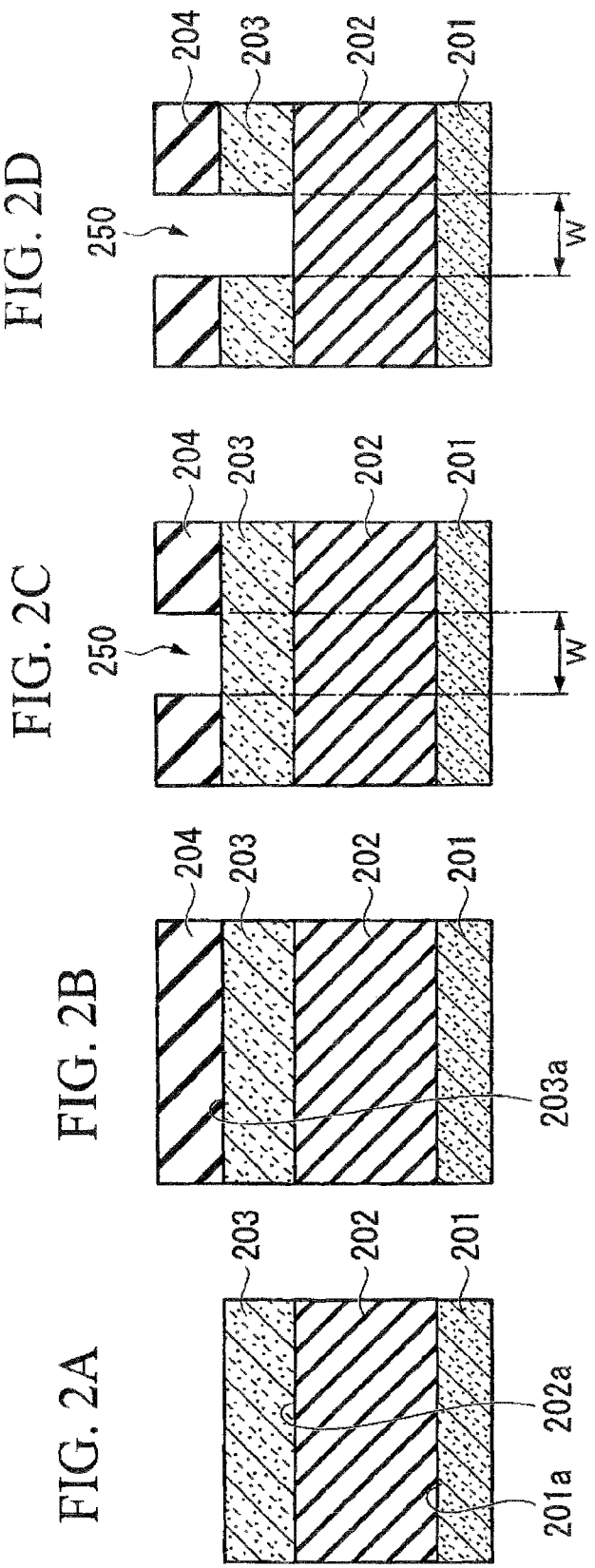

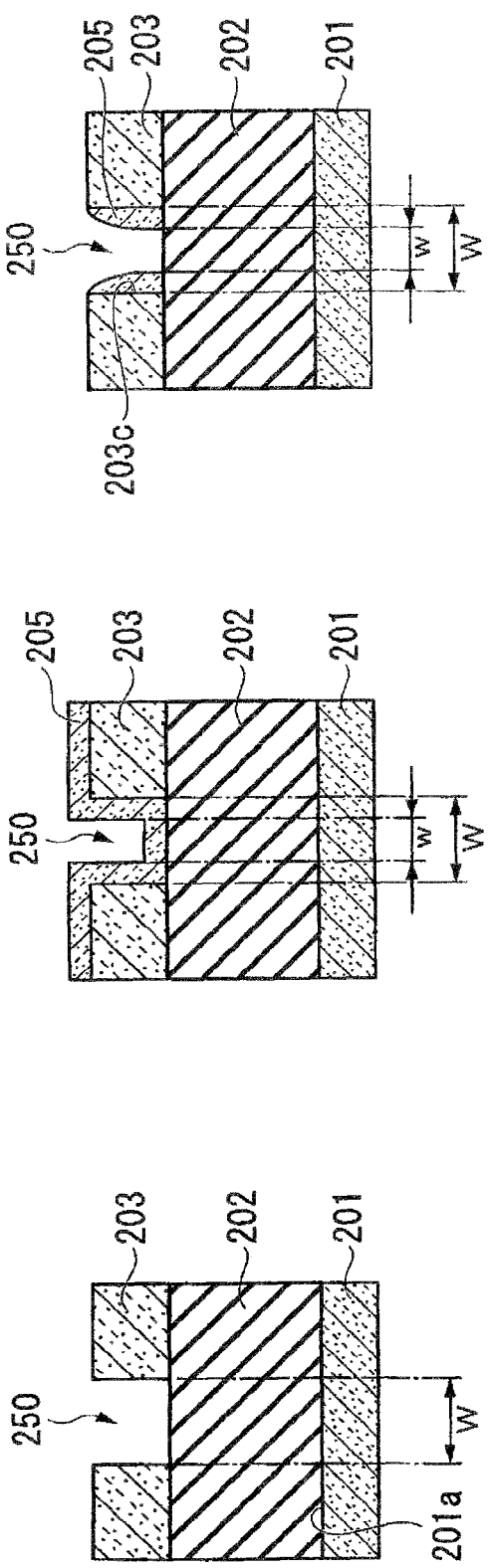

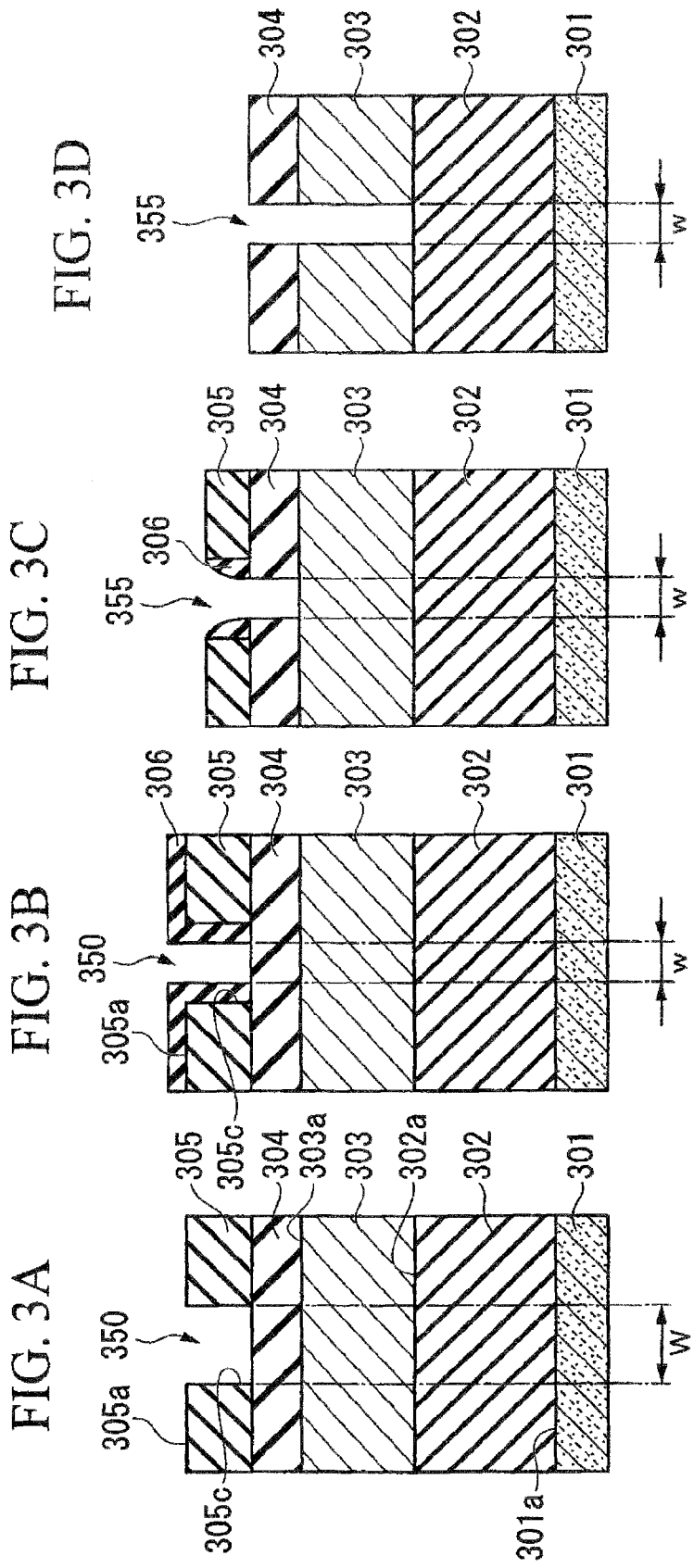

HOLE PATTERN FORMING METHOD AND SEMICONDUCTOR DEVICE MANUFACTURING METHOD

BACKGROUND OF THE INVENTION

1. Field of the Invention

The present invention relates to a method of forming a hole pattern. The present invention in particular relates to a method of forming a hole pattern to be used in a fine wiring pattern of a semiconductor device.

Priority is claimed on Japanese Patent Application No. 2007-263401, filed Oct. 9, 2007, the content of which is incorporated herein by reference.

2. Description of Related Art

The mainstream of microfabrication technology of a semiconductor device is currently photolithography. By means of photolithography, fine hole patterns are formed and semiconductor devices are manufactured.

A hole pattern is a pattern which consists of a recessed portion or groove portion that is formed in an interlayer insulation film prepared on a semiconductor substrate. A hole pattern is formed in various shapes, such as a line shape or L shape or the like when viewed from above. Such a hole pattern can be used for a fine wiring pattern or the like of a semiconductor device.

In recent years, along with the increasing density and increasing integration of semiconductor devices, the need is increasing to form hole patterns consisting of dimensions below the resolution limit of photolithography technology to be used for fine wiring patterns. A number of methods have been proposed to form a hole pattern consisting of dimensions below the resolution limit of photolithography by adding some kind of technology to photolithography in order to meet such a need.

For example, technologies to form such a hole pattern include silicon film hard mask technology that has a sidewall of silicon, RELACS (resolution enhancement lithography assisted by chemical shrink) technology, and resist thermal flow technology.

(Silicon Hard Mask Technology Having a Silicon Sidewall)

A description of this technology shall be given with reference to FIGS. 2A to 2I.

First, as shown in FIG. 2A, for example an interlayer insulation film 202 is formed as an object to be processed on an upper surface 201a of a semiconductor substrate 201. A first silicon film 203 is formed by the LP-CVD (low-pressure chemical vapor deposition) method on an upper surface 202a of the interlayer insulation film 202.

Next, as shown in FIG. 2B, a photoresist layer 204 is formed on an upper surface 203a of the first silicon film 203. Furthermore, as shown in FIG. 2C, a photoresist layer 204 is patterned using a well known lithography technology.

Next, as shown in FIG. 2D, dry etching of the first silicon film 203 is carried out using the photoresist layer 204 as a mask to transfer the pattern of the photoresist layer 204 to the first silicon film 203. Then, the photoresist layer 204 is removed by ashing, and as shown in FIG. 2E, a hole pattern 250 of width W is formed in the first silicon film 203.

Next, as shown in FIG. 2F, a second silicon film 205 is formed to a desired film thickness using the LP-CVD method.

Moreover, as shown in FIG. 2G, etch back is carried out on the silicon film 205 using a well known dry etching technology to leave the second silicon film 205 in the shape of a sidewall on a sidewall surface 203c of the first silicon film 203.

Next, as shown in FIG. 2H, dry etching is performed on the interlayer insulation film 202 with the first silicon film 203 and the second silicon film 205 serving as a hard mask to form a hole pattern 255 of width w (w<W).

Next, as shown in FIG. 2I, the first silicon film 203 and the second silicon film 205 that were used for the hard mask are removed by etching. By doing so, the hole pattern 255 of width w (w<W) is formed in the interlayer insulation film 202.

If the above technology is used, by suitably setting the film thickness of the second silicon film, 205, it is possible to control the width of a hole pattern by the dimension which cannot be formed only with the existing lithography technology.

However, there are issues in this technology of using the first silicon film 203 and the second silicon film 205 for a hard mask. That is, when using the first silicon film 203 and the second silicon film 205 as a mask and etching an oxide film (interlayer insulation film 202), the etching selection ratio cannot be made high. For this reason, it is necessary to set the first silicon film 203 to be thick. As a result, it is unavoidable to also increase the film thickness of the photoresist layer 204 that is used for the mask for patterning the first silicon film 203. However, there are the problems of the photoresist layer 204 with a thick film thickness being hard to resolve and difficult to detail.

Also, time is required for etching the thick silicon films 203, 205, and achieving a practical throughput is difficult. Since unlike the photoresist layer 204, the first silicon film 203 and the second silicon film 205 cannot be readily removed, it is necessary to perform etching removal of the first silicon film 203 and the second silicon film 205 by dry etching, and in that case there is the risk of etching away a portion of the semiconductor substrate 201 that should not be etched.

(RELACS Technology)

Next, RELACS technology shall be described. In RELACS technology, a crosslinking reaction of a polymer is allowed to take place only on the upper surface of a photoresist layer by an acid that is contained in a chemical-sensitization resist. Thereby, RELACS technology controls the dimension of the hole pattern of a photoresist layer, enabling a reduction in the hole pattern width. For example, this technology is disclosed in p. 507 to p. 510 of "Advanced RLACS Technology for ArF Resist" by Mamoru Terai, Toshiyuki Toyoshima, Takeo Ishibashi, Shinji Tarutani, Kiyohisa Takahashi, Yusuke Takano, and Hatsuyuki Tanaka in Journal of Photopolymer Science and Technology, Volume 16, Number 4, (2003).

Moreover, as the hard mask that is used in this technology, a carbon film layer is used that is formed by the PE-CVD (Plasma Enhanced CVD) method and easily removable by ashing. As the carbon film layer, for example, APF (Advanced Patterning Film) of Applied Materials Inc., AHM (Ashable Hard Mask) by Novellus Systems Inc., NCP (Nano Carbon Polymer) by ASM or the like may be used.

Hereinbelow, the description is given using FIGS. 3A to 3F for the dimension control technology that used the RELACS technology with a carbon film layer serving as the hard mask.

First, an interlayer insulation film 302 is formed on an upper surface 301a of a semiconductor substrate 301. A carbon film layer 303 is formed with the PE-CVD or the like on an upper surface 302a of the interlayer insulation film 302. Furthermore, an intermediate mask layer 304 which consists of an oxide film is formed on an upper surface 303a of the carbon film layer 303. After applying a photoresist layer 305 on the intermediate mask layer 304, as shown in FIG. 3A, a hole pattern 350 of width W is formed in the photoresist layer 305 using a well known lithography technology.

Next, as shown in FIG. 3B, a RELACS polymer 306 is formed using the RELACS technology on an upper surface 305a and a sidewall surface 305c of the photoresist layer 305.

Next, as shown in FIG. 3C, dry etching of the intermediate mask layer 304 is carried out using the RELACS polymer 306 and the photoresist layer 305 as a mask, and a hole pattern 355 of width w (w<W) is formed.

Next, as shown in FIG. 39, dry etching of the carbon film layer 303 is carried out using the intermediate mask layer 304 that has been patterned as a mask. At this time if the photoresist layer 305 is set to be thinner than the carbon film layer 303, the photoresist layer 305 and the RELACS polymer 306 are automatically removed.

Next, as shown in FIG. 3A, dry etching of the interlayer insulation film 302 is carried out using the carbon film layer 303 that has been patterned as a mask. At this time, the intermediate mask layer 304 is automatically removed by etching.

Finally, as shown in FIG. 3B, the carbon film layer 303 is removed by an oxygen plasma ashing process. By doing so, the hole pattern 355 of width w (w<W) is formed in the interlayer insulation film 302.

This method has a number of advantages compared to the technology that uses a silicon film as a hard mask as described above. For example, since the photoresist layer 305 should withstand patterning of the intermediate mask layer 304, it is possible to make the film thickness of the photoresist layer 305 comparatively thin, which has the advantage of being readily microfabricated, Also, the RELACS polymer 306 that is used for controlling the dimension can be removed simultaneously with the photoresist layer 305. In this way, although the steps appear at first to be complex, due to such reasons as each layer being automatically removed, the number of steps is held down.

However, in this RELACS process, the acid in the resist is insufficient when forming a fine pattern. For this reason, a hole pattern dependency occurs in the film thickness of the RELACS polymer 306 that is formed. Also, the acid reactivity in the photoresist layer 30 falls after patterning due to a minute amount of ammonia in the atmosphere. For this reason, there is also the issue of highly accurate film thickness control being difficult.

(Photoresist Layer Thermal Flow Technology)

Next, photoresist layer thermal flow technology shall be described. This technology is disclosed in "Forming sub-100 nm contact holes" by Takamitsu Furukawa, Norio Moriyama, Kazuo Sawai, and Hiroshi Onoda in OKI Technical Review, April 2002/Issue 190 Vol. 69 No. 2, pp. 58-61. This technology is a process that actively utilizes a thermal flow in a patterned photoresist.

First, as shown in FIG. 4A, a hole pattern 450 is formed in a photoresist layer 405. Then, a thermal process is performed to generate a thermal flow in the photoresist layer 405 in the direction of the arrows shown in FIG. 4B, and the hole pattern 450 of width W is made into a hole pattern 455 of width w (w<W). Then, the hole pattern 455 of width w is finally formed in the interlayer insulation film 402 similarly to the method disclosed above.

In this method, there is a tendency for the thermal flow to depend on the size and shape of the hole pattern 450. For this reason, there is the risk of dimensional differences occurring due to the density and shape of the hole pattern 450.

As another conventional technology, Japanese Unexamined Patent Application, First Publication No. 2007-027180 discloses a method of manufacturing a semiconductor device capable of easily forming a high aspect ratio fine contact hole with good controllability.

This method is a manufacturing method of a semiconductor device for forming an opening in an insulation film that is an object to be processed. This manufacturing method includes following steps: a step of forming an insulation film on a substrate, a step of forming a hole pattern consisting of a first etching mask (photoresist layer) on the insulation film, a step of forming a first hole by making an etching opening midway in this insulation film with this hole pattern serving as a mask, a step of forming a second etching mask (carbon film layer formed by the CVD method) on the top portion of the insulation film and in a sidewall shape on the sidewall of the first hole that is opened midway after removing the first etching mask, and a step of etching the insulation film that remains at a lower portion to form a second hole with the second etching mask serving as a mask.

But, in this method, in order to open a small pore (the second hole), a large pore (the first hole) must be formed first. For that reason, a step in the pore diameter ends up being formed, and so the problem arises of its applications being limited.

This patent document also discloses a method including following steps: a step of forming an insulation film such as a nitride film on a film of the object to be processed, separately from the insulation film that is the object to be processed, a step of forming a first hole in this insulation film, and a step of selectively removing the nitride film by heated phosphoric acid after forming a second hole. This method also cannot be used in the case of metal wiring or the like being under a hole, and so the problem arises of its applications being limited.

In this patent document, the second etching mask that is formed on the sidewall of the first hole is envisaged as a carbon film layer. In a semiconductor process, a carbon film layer formation technology includes the PE-CVD method and the LP-CVD method. Although the PE-CVD method enables film formation at a low temperature (around 400° C.), the step coverage is poor, and so it is unsuitable for stringent dimension control that is required for forming a hole pattern of 60 nm or less. The LP-CVD method can form a carbon film layer with good coverage if ethylene gas is used, but requires a high temperature of around 800° C., and so the problem arises of its applications being limited.

Japanese Unexamined Patent Application, First Publication No. H09-045633 discloses a method of forming a fine contact hole of a semiconductor integrated circuit. This forming method includes following steps: a step of forming a carbon thin film on an insulation film that is the object to be processed, a step of forming a photoresist layer thin film on the carbon thin film, a step of patterning the photoresist layer thin film by photolithography, a step of etching the carbon thin film into a normal tapered shape with the photoresist layer thin film serving as a mask, and a step of etching the insulation film that becomes the work target object with the patterned carbon film layer and the photoresist layer thin film serving as a mask. That is, by patterning the carbon film layer into a normal tapered shape by the photoresist layer that is a similar carbon-based film, the hole diameter is narrowed, and a small hole is formed.

But, in this method, the selection ratio cannot be made high during etching of the carbon film layer since etching of the carbon-based film is performed using a similar carbon-based film as a mask. For that reason, the photoresist layer must have a thickness equal to or greater than the carbon film layer.

Moreover, the film thickness of the carbon film layer depends on the film thickness of the insulation film that is the work target and the etching conditions. Thereby, if the film thickness of the insulation film that is the work target differs, the need arises to change not only the film thickness of the carbon film layer but also the film thickness of the photoresist layer. However, in the current fine processing, the film thickness of the photoresist layer is optically optimized in order to avoid such effects as a stationary wave effect due to reflection of light, and so arbitrarily setting the film thickness is difficult.

Furthermore, if the film thickness of the carbon film layer changes, the condition for processing the carbon film layer into a normal tapered shape must also change.

In this manner, mutually dependent parameters become intricately entwined, and so just by changing the film thickness, the problem arises of the optimization becoming extremely difficult.

Japanese Unexamined Patent Application, First Publication No. H11-261025 discloses a method including following steps: a step of for g a first insulation film and a second insulation film that are work targets on a semiconductor substrate, a step of forming a photoresist layer pattern that serves as a mask on the second insulation film, a step of forming a hole in the second insulation film by etching using the photoresist layer pattern as a mask, a step of narrowing the hole diameter by for g a sidewall that contains a component of the photoresist on the sidewall of the hole in a reaction chamber of an etching apparatus, and a step of forming a hole in the first insulation film by etching with the photoresist layer and the sidewall serving as a mask.

This technology resembles the technology disclosed in Japanese Unexamined Patent Application, First Publication No. 2007-027180 mentioned above. However) it differs on the point of the formation of a sidewall (carbon-based film) that consists of a component of the photoresist layer for obtaining a small hole diameter being conducted in a reaction chamber of an etching apparatus.

The formation of the carbon film layer, which is performed in succession to processing of the second insulation film by etching, depends on the history of the etching chamber. For this reason, the etching conditions of the second insulation film affect the formation of a carbon-based film. Also, the problem arises of the thickness of the sidewall easily changing due to the denseness/sparseness of the hole pattern.

Accordingly, there are the problems of independently controlling the etching conditions of the second insulation film and the formation of the carbon-based film being difficult, and lacking the strict dimension controllability required for the device manufacture of 60 nm onward.

SUMMARY

The present invention seeks to solve one or more of the above problems, to improve upon those problems at least in part.

In one embodiment, there is provided a hole pattern forming method that forms a fine hole pattern in a work target layer that is formed on a semiconductor substrate, includes: forming a three-layer structure by laminating a carbon film layer, an intermediate mask layer, and a photoresist layer in that order on the work target layer; after patterning a hole pattern in the photoresist layer, patterning the hole pattern in the intermediate mask layer with the patterned photoresist layer serving as a mask; forming a sidewall oxide film on exposed portions of the photoresist layer, the intermediate mask layer, and the carbon film layer; forming a sidewall portion that includes the sidewall oxide film on inner wall surfaces of the hole pattern by etching back the sidewall oxide film; and after patterning a fine hole pattern in the carbon film layer with the sidewall portion and the intermediate mask layer serving as a mask, patterning the fine hole pattern in the work target layer with the patterned carbon film layer serving as a mask.

According to the embodiment of the present invention, it is possible to provide a method of forming a hole pattern below the resolution limit independently of the denseness/sparseness of the hole pattern.

BRIEF DESCRIPTION OF THE DRAWINGS

The above features and advantages of the present invention will be more apparent from the following description of certain preferred embodiments taken in conjunction with the accompanying drawings, in which:

FIG. 1A to FIG. 1L are process schematic views showing one example of the hole pattern forming method according to a first embodiment of the present invention;

FIGS. 2A to 2I are process schematic views showing one example of a conventional hole pattern forming method;

FIGS. 3A to 3F are process schematic views showing one example of another conventional hole pattern forming method;

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

FIGS. 1A to 1L are cross-sectional views of step sequences for describing one example of a hole pattern forming method according to a first embodiment of the present invention.

The hole pattern forming method according to a first embodiment of the present invention includes a work target layer formation step, a three-layer structure formation step, an intermediate mask layer patterning step, a sidewall oxide film formation step, a sidewall portion formation step, a work target layer patterning step, and a final treatment step.

(Work Target Layer Formation Step)

Figure 1A:
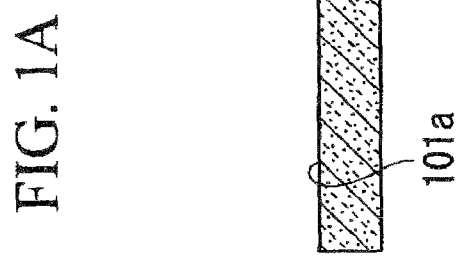
Figure 1B:
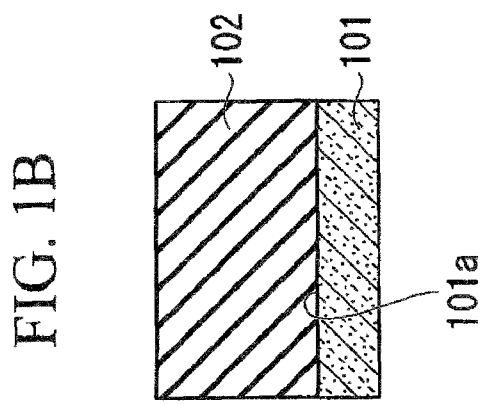

First, as shown in FIGS. 1A and 1B, a work target layer 102 is formed on an upper surface 101a of a semiconductor substrate 101.

Besides functional elements such as a transistor and the like, a contact plug, wiring, and the like are already formed on the semiconductor substrate 1001.

The work target layer 102 is the layer in which the hole pattern is formed. The work target layer 102 is an interlayer insulation film which consists, for example, of a silicon oxide film. The work target layer 102 is formed at a film thickness of for example 400 nm (Three-Layer Structure Formation Step)

A three-layer structure 120 is a structure formed by laminating a carbon film layer 103, an intermediate mask layer 104, and a photoresist layer 105 in that order. This three-layer structure 120 is formed on the work target layer 102.

Figure 1C:
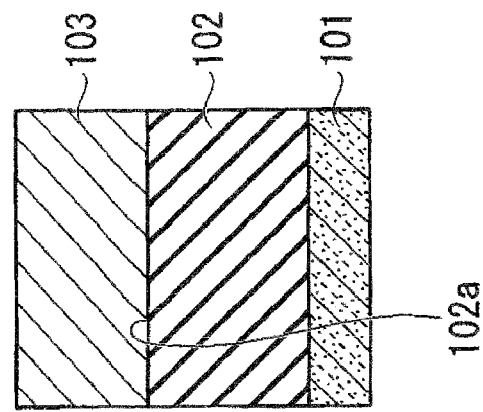

First, using the PE-CVD method or the like, as shown in FIG. 1C, the carbon film layer 103 is formed on the work target layer 102.

It is preferable that the carbon film layer 103 be an amorphous carbon film layer. This is because, in the case of using an amorphous carbon film layer, it is possible to make the etching selectivity high and suppress the roughness of the line edge, and is possible to strictly control the dimensions.

For example, APF (Advanced Patterning Film) of Applied Materials Inc., MEN (Ashable Hard Mask) by Novellus Systems Inc., NCP (Nano Carbon Polymer) by ASM or the like may be used. The carbon film layer 103 is formed at a film thickness of for example 200 nm.

Figure 1D:
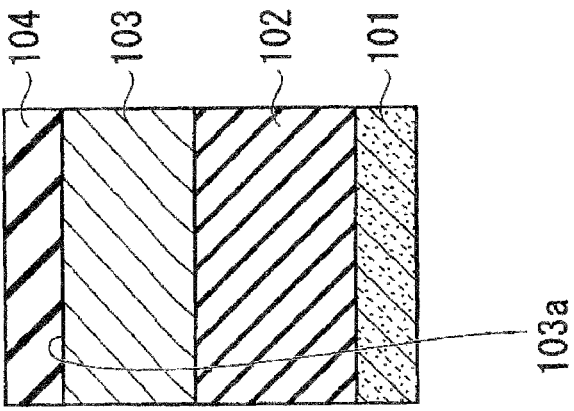
Figure 3E:
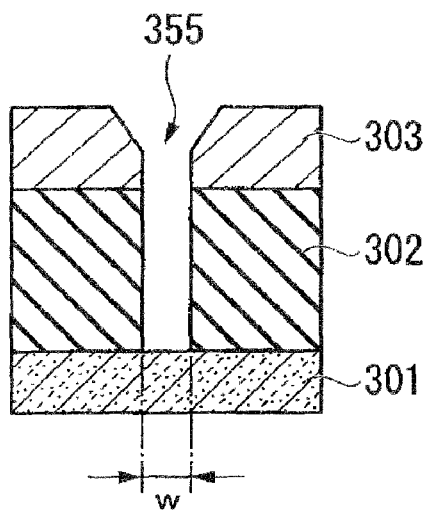
Figure 3F:
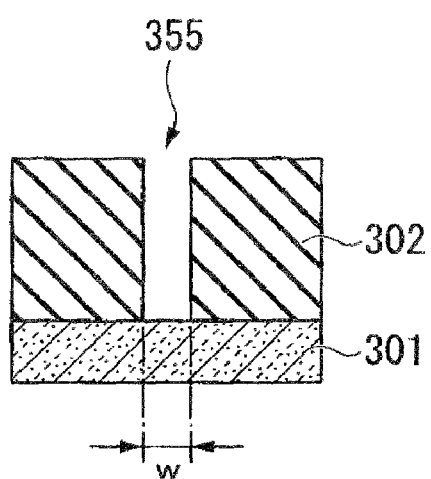
Figure 4A:
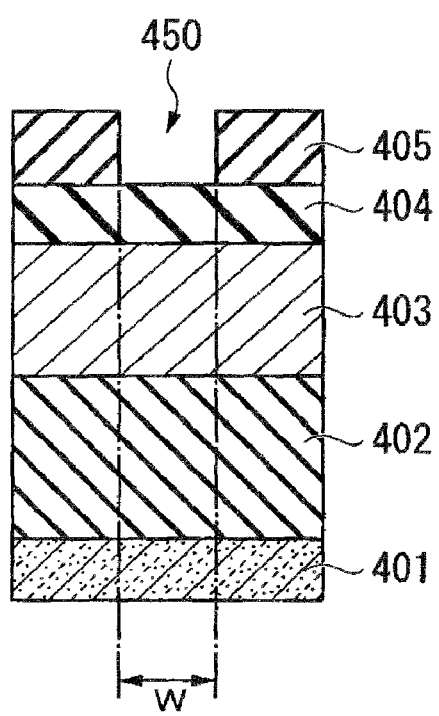
FIGS. 4A and 4B are process schematic views showing one example of yet another conventional hole pattern forming method.
Figure 4B:
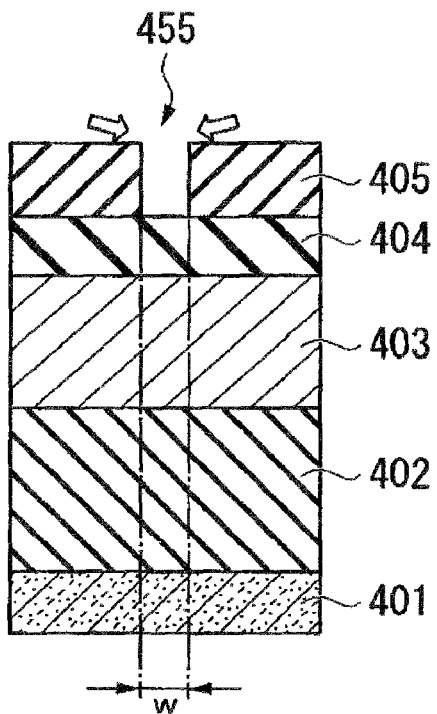

Next, using the PE-CVD method, the intermediate mask layer 104 is formed on the carbon film layer 103 as shown in FIG. 1D.

The intermediate mask layer 104 is only required to be an oxide film, and is only required to be a film that basically has silicon dioxide ($SiO_2$) as its main material. The intermediate mask layer 104 may be a laminated film, and for example may be a laminated film of NFDARC (nitrogen-free dielectric anti-reflection coating) and a USG (un-doped silicate glass).

NFDARC is a material provided by Applied Materials Inc., and is a silicon dioxide ($SiO_2$) film that contains carbon as an impurity. NFDARC is a material that enables film formation from a gas system including $SiH_4$ gas and $CO_2$ gas using the PE-CVD method.

It is preferable that the film thickness of the intermediate mask layer 104 is in the range of 30 to 50 nm. If the film thickness of the intermediate mask layer 104 is in this range, it is possible to make the intermediate mask layer 104 satisfy optical characteristics as an antireflection film. If the thickness of the intermediate mask layer 104 is thicker or thinner than this range, the antireflection performance is lowered.

For this reason, even in the case of constituting the intermediate mask layer 104 as a laminated film, for example, by laminating USG with a film thickness of 30 nm on NFDARC with a film thickness of 15 nm, the film thickness of the intermediate mask layer 104 is preferably made to be in the above range.

In the case of incorporating the performance of an antireflection film in the intermediate mask layer 104, by adding nitrogen or carbon in the intermediate mask layer 104, it is possible to control its optical characteristics.

In the case of using a chemical sensitization resist in the next step, in order to avoid poisoning due to ammonia that originates from nitrogen in the film, it is preferable to adjust the optical characterstics by adding carbon to the intermediate mask layer 104.

Next, the photoresist layer 105 is formed on the intermediate mask layer 104 as shown in FIG. 1E using a dipping method, spin coating method or the like. The film thickness of the photoresist layer 105 is for example 150 nm.

The film thickness of the photoresist layer 105 is thinner than the film thickness of the carbon film layer 103. As described below, this is because the photoresist layer 105 is completely removed by etching in the work target layer patterning step.

As the material of the photoresist layer 105, it is possible to use a photoresist layer material that is generally used, such as 2,3,4-trihydroxybenzophenone, 2,3,4,4'-tetrahydroxybenzophenone and the like.

(Intermediate Mask Layer Patterning Step)

Using well known lithography technology, a hole pattern 50 with a width W is formed in the photoresist layer 105 as shown in FIG. 1F. For example, this width W is formed at the resolution limit of well known lithography technology.

Moreover, as shown in FIG. 1G, the hole pattern 50 is patterned in the intermediate mask layer 104 with this photoresist layer 105 serving as a mask.

(Sidewall Oxide Film Formation Step)

Next, as shown in FIG. 1H, a sidewall oxide film 106 is formed so as to cover an upper surface 105a and an exposed sidewall surface 105c of the photoresist layer 105, an exposed sidewall surface 104c of the intermediate mask layer 104, and an exposed upper surface 103a of the carbon film layer 103. As a result, the width of the hole pattern 50 is narrowed to width w (w<W). This width w can be formed at a width smaller than the width which can be formed by the resolution limit of a well known lithography technology.

It is preferable that the sidewall oxide film 106 is formed using the ALD (Atomic Layer Deposition) method. This is because the ALD method can form a film in a low temperature atmosphere, has excellent film thickness control, and moreover can form a good quality film that has excellent coverage.

The ALD method is a method of supplying two or more kinds of gas and gaseous raw materials to a reaction chamber in and forming a film by a chemical reaction on the upper surface of a wafer. The ALD method is a method that is capable of forming a film thickness of 1 atomic-layer level with high precision by one sequence.

In the ALD method, for example the source gas of silicon and oxygen ($O_2$) gas that is excited in an RPS (remote plasma source) unit are introduced into a reaction chamber by turns.

It is preferable that the sidewall oxide film formation step is conducted in an atmosphere below the softening temperature of the photoresist layer 105. That is, it is preferable that the sidewall oxide film formation step be carried out by setting the process temperature in the reaction chamber to below the softening temperature of the photoresist layer 105.

In the case of performing the sidewall oxide film formation step in an atmosphere below the softening temperature of the photoresist layer 105, it is possible to not cause a thermal flow of the photoresist layer 105. For that reason, it is possible to form the sidewall oxide film 106 with the photoresist layer 105 maintained in a stable state, and possible to maintain the dimension controllability of the hole pattern 50.

On the contrary, in the case of carrying out the formation of the sidewall oxide film 106 in the temperature range that causes a thermal flow in the photoresist layer 105, that is, the temperature range at or above the softening temperature, it is not possible to maintain the dimension controllability of the hole pattern 50 formed in the photoresist layer 105.

For example, the sidewall oxide film formation step is performed in an atmosphere of 150° C. or less, that is, with the process temperature in the reaction chamber set to 150° C. or less.

By at least setting it to an atmosphere of 150° C. or less, it is possible to control thermal flow of the photoresist layer 105, and thereby possible to maintain the dimensional controllability of the hole pattern 50.

Specifically, in the sidewall oxide film formation step, after setting the process temperature in the reaction chamber to, for example 100° C., the following film formation cycle is repeated a plurality of times.

In this cycle of the film formation process is as follows. First, after BTBAS (Bis tertial butyl amino silane) is initially charged as a silicon source gas into a reaction chamber; it is purged. Next, after oxygen ($O_2$) gas that is excited in an RPS unit is introduced into the reaction chamber, it is again purged.

In this manner, initially BTBAS is charged into the reaction chamber, and thereafter in each cycle BTBAS flows before the oxygen ($O_2$) gas. For this reason, the oxide film is formed at the stage of introducing the oxygen ($O_2$) gas, and since this becomes a protective film, the oxygen ($O_2$) gas does not react with the photoresist layer 105 or the carbon film layer 103.

If, initially, oxygen ($O_2$) gas that is excited in an RPS unit is used, the photoresist layer 105 or the carbon film layer 103 is etched by this oxygen ($O_2$) gas in the initial stage of film formation. Accordingly, it is not preferred.

Although depending on conditions such as the process temperature, gas flow rate and gas pressure, in the case of using a silicon substrate with no pattern, it is possible to form a film with a thickness of approximately 0.2 nm in 1 cycle of the above-mentioned film process.

For that reason, if it is desired to narrow the width of the hole pattern by for example by 10 nm, a film with a thickness of 5 nm is formed on the sidewall surfaces 104c of either sides. Thereby, 1 cycle of the abovementioned film formation process should be performed 25 times.

As the sidewall oxide film 106, it is possible to use low temperature ALD-$SiO_2$ (film formation temperature=100° C. to 150° C.) by Tokyo Electron. Ltd., or PDL (pulsed deposition layer) (film formation temperature=70° C. to 150° C.) by Novellus Systems Inc.

(Sidewall Portion Formation Step)

Next, the sidewall oxide film 106 is etched back, and the sidewall oxide film 106 is made to remain in a sidewall shape. Simultaneously with this, the upper surface 103a of the carbon film layer 103 is exposed at a bottom surface 50b of the hole pattern 50. By doing so, as shown in FIG. 1I, the sidewall oxide film 106 is made into a sidewall portion 116. Since the sidewall portion 116 is formed, the width of the bottom surface 50b of the hole pattern 50 is narrowed from width W to width w (w<W).

(Work Target Layer Patterning Step)

Next, dry etching of the carbon film layer 103 is performed until the upper surface 102a of the work target layer 102 is exposed, with the intermediate mask layer 104 and the sidewall oxide film 106 left in a sidewall shape serving as a mask. Since the film thickness of the photoresist layer 105 is formed to be thinner than the carbon film layer 103, the photoresist layer 105 is automatically removed in this step. As shown in FIG. 1J, a hole pattern 55 of width w (w<W) is formed in the carbon film layer 103.

Next, dry etching of the work target layer 102 is Performed until the upper surface 101a of the semiconductor substrate 101 is exposed, with the carbon film layer 103 serving as a mask. The intermediate mask layer 104 and the sidewall oxide film 106 are automatically removed by etching in this step, and as shown in FIG. 1K, the hole pattern 55 of width w (w<W) is formed in the work target layer 102.

(Final Treatment Step)

Finally, the carbon film layer 103 is removed by an oxygen plasma ashing process. As a result, as shown in FIG. 1L) a fine pattern consisting of the hole pattern 55 of width w (w<w) is formed in the work target layer 102.

Since the carbon film layer 103 that is used as a mask in forming the hole pattern 55 of width w (w<W) in the work target layer 102 is removed by an oxygen plasma ashing process, this technology is called ashable hard mask technology.

The first embodiment was concerned with the hole pattern 55, but it is not necessarily applied only to the hole pattern 55. For example, by vapor depositing metal on this hole pattern 55, it can be utilized as a fine wiring pattern with a narrow width.

Also, the hole pattern forming method according to the embodiment of the present invention is effective for forming a hole pattern below the resolution limit of conventional lithography technology, and is particularly effective for formation of a hole pattern with a width of 60 nm or less.

The hole pattern forming method according to the embodiment of the present invention includes forming a three-layer structure by laminating the carbon film layer 103, the intermediate mask layer 104, and the photoresist layer 105 in that order on the work target layer 102, and forming hole patterns 50, 55 in several stages in each layer. For this reason, the hole pattern 50 with a width W that is formed in the photoresist layer 105 using a conventional lithography method and etching method can be converted to the hole pattern 55 of width w (w<W) with a high degree of accuracy. Thereby, it is possible to form the hole pattern 55 of width w (w<W) with good control in the work target layer 102.

The hole pattern forming method according to an embodiment of the present invention includes forming the sidewall oxide film 106 in an atmosphere on the exposed portions of the photoresist layer 105, the intermediate mask layer 104, and the carbon film layer 103. For this reason, it is possible to form the sidewall oxide film 106 with the film thickness controlled with a high degree of accuracy without generating a thermal flow in the photoresist layer 105, that is, while maintaining the dimension controllability of the hole pattern 50 formed in the photoresist layer 105. Thereby, it is possible to reduce the width W of the hole pattern 50 with a high degree of accuracy and good controllability.

The hole pattern forming method according to the embodiment of the present invention includes forming the sidewall oxide film 106. For this reason, it is possible to use the sidewall oxide film 106 that has good film thickness controllability and excellent coverage, and thereby it is possible to reduce the dependency of the dimension controllability with respect to the density and shape of the hole pattern 50. Therefore, it is possible to accurately form the fine hole pattern 55.

The hole pattern forming method according to the embodiment of the present invention includes forming the sidewall oxide film 106 on the sidewall surface 104c of the hole pattern 50 of the intermediate mask layer 104 by combining the sidewall oxide film 106 formation technology and ashable hard mask technology to control the width dimension of the hole pattern 55 of the carbon film layer 103. For this reason, it is possible to form the sidewall oxide film 106 having excellent in-plane uniformity, coverage, and film thickness controllability. Thereby, it is possible to form the fine pattern 55 with good dimension control in the work target layer 102 independently of the width W or shape of the hole pattern 50.

The hole pattern forming method according to the embodiment of the present invention includes forming the sidewall portion 116 that includes the sidewall oxide film 106 on the inner wall surfaces of the hole pattern 50 by etching back the sidewall oxide film 106. For this reasons it is possible to accurately make the width W of the hole pattern 50 a narrow width w (w<W), and thereby possible to accurately form the fine hole pattern 55.

The hole pattern forming method according to the embodiment of the present invention includes accurately making the width W of the hole pattern 50 a narrow width w (w<W) by forming the sidewall portion 116 that includes the sidewall oxide film 106. Thereby, it is possible to form the hole pattern 55 below the resolution limit independently of the denseness/sparseness of the hole pattern 50.

The hole pattern forming method according to the embodiment of the present invention includes forming the sidewall oxide film 106 using the ALD (atomic layer deposition) method. For this reason, it is possible to form the sidewall oxide film 106 with a high degree of accuracy. Thereby, it is possible to accurately form the fine hole pattern 55.

In the hole pattern forming method according to the embodiment of the present invention, the carbon film layer 103 includes amorphous carbon. For his reason, the etching selectivity is high, and thereby it is possible to suppress roughness of the line edge. Thereby, it is possible to accurately form the fine hole pattern 55.

The hole pattern forming method according to the embodiment of the present invention uses ashable hard mask technology. For this reason, the etching selection ratio between the carbon film layer 103 and the intermediate mask layer 104 can be readily made high, and the photoresist layer 105 need only be able to serve as a mask for processing of the intermediate mask layer 104 that is comparatively tin. For this reason, it is possible to choose an optically optimal film thickness of the photoresist layer 105 independently of the thickness of the work target layer 102. Thereby, it is possible to realize control of an unresolvable dimension in lithography technology.

In the hole pattern forming method according to the embodiment of the present invention, as the sidewall portion 116 that is used for dimension control, the sidewall oxide film 106 that is formed under the softening temperature of the photoresist layer 105 is used. For this reason, it is possible not to cause thermal load problems in most semiconductor processes. Therefore, it can be used with a high degree of general versatility without restricting applications.

The semiconductor device manufacturing method according to the embodiment of the present invention uses the aforementioned hole pattern forming method. For is reason, it is possible to form the fine hole pattern 55 with a higher degree of accuracy than conventional lithography processes. Therefore, it is possible to form a semiconductor device that has a fine wiring pattern with a high yield.

Second Embodiment

A hole pattern is formed similarly to the first embodiment except for using as the sidewall oxide film 106 a PDL (pulsed deposition layer) by Novellus Systems Inc.

That is, a hole pattern forming method according to a second embodiment of the present invention includes a work target layer formation step, a three-layer structure formation step, an intermediate mask layer patterning step, a sidewall oxide film formation step, a sidewall portion formation step, a work target layer patterning step, and a final treatment step. In the following description, members that are the same as members used in the first embodiment are denoted by the same reference numerals.

The PDL used as the sidewall oxide film 106 is an oxide film that consists of a cross-linked silica as disclosed in Dennis Hausmann et al.: "Rapid Vapor Deposition of Highly Conformal Silica Nanolaminates", Science, vol. 298, Oct. 11, 2002, pp. 402-406. PDL is al oxide film that is formed using a film forming method that applies ALD with tri-methyl-aluminum (TMA) and tris(tert-butoxy)silanol as raw materials.

In this film forming method, TMA is initially introduced into a reaction chamber, and then adsorbed on the upper surface 101a of the semiconductor substrate 101. Next, by introducing tris(tert-butoxy)silanol into the reaction chamber, the TMA that is absorbed on the upper surface 101a of the semiconductor substrate 101 performs a catalytic action so that a silica cross-linking reaction is caused on the upper surface 101a of the semiconductor substrate 101. By repeating this film formation process cycle a plurality of times, it is possible to form the sidewall oxide film 106 having the target thickness.

All of the steps are performed in an atmosphere of 60° C. to 150° C., and it is capable of producing the sidewall oxide film 106 with good coverage, and capable of producing a film that is suited to controlling the width dimension.

The hole pattern forming method according to the embodiment of the present, invention PDL is used as the sidewall oxide film 106. That is, the sidewall oxide film 106 is an oxide film that contains a cross-linked silica. For this reason, since it is possible to precisely control the film thickness and possible to carry out formation with a film formation speed faster than ALD, it is possible to improve the productive efficiency.

Hereinbelow, the present invention is described in detail based on examples. However, the present invention is not restricted to only these examples.

EXAMPLES

First Example

Work Target Layer Formation Step

First, a work target layer consisting of a silicon oxide interlayer insulation film with a thickness of 400 nm was formed on the upper surface of a semiconductor substrate.
(Three-Layer Structure Formation Step)
Next, the carbon film layer having a thickness of 200 nm is formed on that work target layer using the PE-CVD method. Next, a NFDARC with a thickness of 15 nm is formed on that carbon film layer using the PE-CVD method, and moreover USG (Un-doped Silicate Glass) with a thickness of 30 nm is formed to make the intermediate mask layer. Next, the photoresist layer with a thickness of 150 nm is formed on that intermediate mask layer using the spin coating method.
(Intermediate Mask Layer Patterning Step)
Next, after forming the hole pattern in the photoresist layer using a well known lithography technology, the intermediate mask layer was patterned with this photoresist layer serving as a mask.
(Sidewall Oxide Film Formation Step)
Next, a sidewall oxide film was formed using the ALD method in an atmosphere of a process temperature of 100° C. so as to cover the upper surface and exposed sidewall surface of the photoresist layer, the exposed sidewall surface of the intermediate mask layer, and the exposed upper surface of the carbon film layer. In this ALD method, after BTBAS (Bis tertial butyl amino silane) was introduced into the reaction chamber as the silicon source gas, it was purged, and then after oxygen (O$_2$) gas that was excited in an RPS unit was introduced into the reaction chamber, it was again purged. This process cycle was repeated 25 times.
(Sidewall Portion Formation Step)
Next, the sidewall oxide film was etched back, and the sidewall oxide film was left in a sidewall shape. Simultaneously with this, the upper surface of the carbon film layer was exposed at the bottom surface of the hole pattern. By doing so, the sidewall oxide film is made into a sidewall portion.
(Work Target Layer Patterning Step)
Next, dry etching of the carbon film layer was performed with the intermediate mask layer and the sidewall oxide film left in a sidewall shape serving as a mask. As a result, the upper surface of the work target layer was exposed at the bottom surface of the hole pattern. Since the photoresist layer was formed to be thinner than the carbon film layer, the photoresist layer was automatically removed by is step.

Next, dry etching of the work target layer was performed with the patterned carbon film layer serving as a mask. As a result, the upper surface of the semiconductor substrate was exposed at the bottom surface of the hole pattern. The intermediate mask layer and the sidewall oxide film were automatically removed by etching with this step.

(Final Treatment Step)

Finally, the carbon film layer was removed by an oxygen plasma ashing process. As a result, a fine pattern was formed in which the hole pattern width of the work target layer was 10 nm narrower compared to the hole pattern width that was formed on the photoresist layer.

Second Example

A hole pattern was formed similarly to the first example except for using as the sidewall oxide film PDL by Novellus Systems Inc.

TMA was initially introduced into a reaction chamber, and the TMA was adsorbed on the upper surface and exposed sidewall surface of the photoresist layer, the exposed sidewall surface of the intermediate mask layer, and the exposed upper surface of the carbon film layer. Next, by introducing tris(tert-butoxy)silanol into the reaction chamber, the TMA that was absorbed on the film formation surface performed a catalytic action so that a silica cross-linking reaction was caused on the film formation surface. By repeating this film formation process cycle 25 times, the sidewall oxide film consisting of PDL of the target film thickness was formed. This step was performed in an atmosphere of 60° C. to 150° C.

The following steps were performed by the same steps as the first example. A fine pattern was formed in which the hole pattern width of the work target layer was 10 nm narrower compared to the hole pattern width that was formed on the photoresist layer.

First Comparative Example

It was attempted to form a hole pattern similarly to the first example except for forming the sidewall oxide film 506 directly after forming the pattern of the photoresist layer 505.

(Sidewall Oxide Film Formation Step)

Figure 5A:
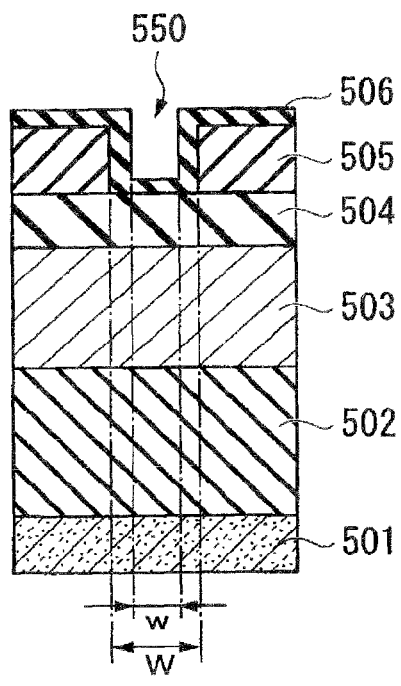
FIGS. 5A and 5B are process schematic views showing one example of a first comparative hole pattern forming method.

As shown in FIG. 5A, after forming the hole pattern 550 on the photoresist layer 505, the sidewall oxide film 506 was formed.

(Intermediate Mask Layer Patterning Step)

Figure 5B:
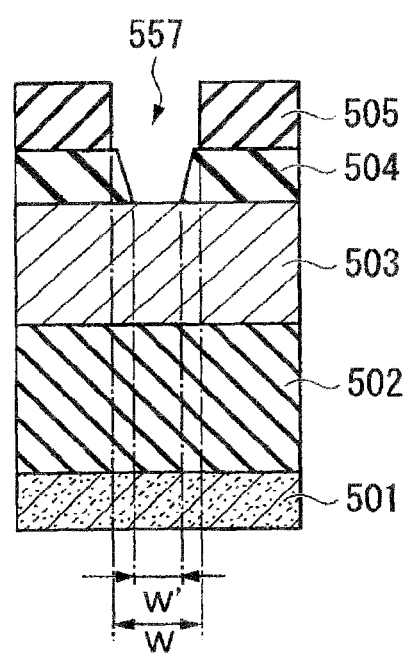

Next, the sidewall oxide film 506 was etched back to form the sidewall portion. Then, the intermediate mask layer 504 was dry etched with the sidewall portion and photoresist layer 505 serving as a mask. However, as shown in FIG. 5B, before forming the desired hole pattern, the sidewall oxide film 506 that forms the sidewall portion could not withstand and was thus removed by etching. As a result, a hole pattern 557 was formed with the width W' (w<W'<W) in the intermediate mask layer 504.

This result is considered to be because the film quality of the sidewall oxide film 506 was inferior compared to the film quality of the intermediate mask layer 504 formed in the atmosphere of 400° C. using the oxide film-based material, and thus the etching rate of the sidewall oxide film 506 was greater than the etching rate of the intermediate mask layer 504.

The sidewall oxide film 506 has sufficient resistance to oxygen ($O_2$) gas that is used when etching the carbon film layer 503. For this reason, it was found out that an approach that involves forming a sidewall oxide film after patterning the intermediate mask layer and etching the carbon film layer with the intermediate mask layer and the sidewall oxide layer serving as a mask as performed in the first example is excellent.

Second Comparative Example

It was attempted to form a hole pattern similarly to the first example except for removing the photoresist 605 after transferring the hole pattern 650 of the photoresist 605 to the intermediate mask layer 604.

This is because, since the carbon film layer 603 has heat resistance to about 550° C., if the photoresist layer 605 is removed, it was considered possible to apply an $O_3$/TEOS-based sub-atmospheric CVD oxide film (process temperature of about 540° C.) that is generally used in semiconductor manufacturing processes even without using special sidewall oxide film formation technology as in the embodiments of the present invention.

Figure 6A:
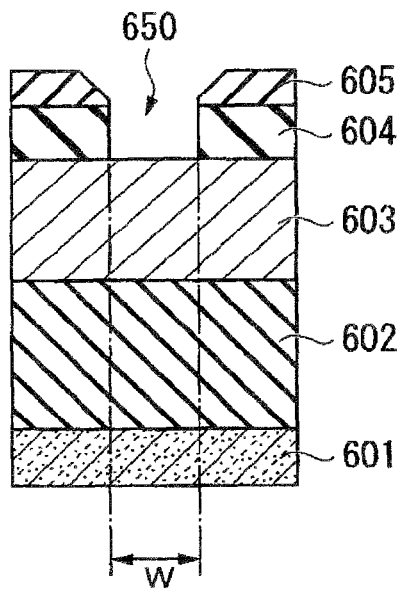
FIGS. 6A and 6B are process schematic views showing one example of a second comparative hole pattern forming method.

Similarly to the first example, the steps were performed until the patterning of the intermediate mask layer, and by dry etching as shown in FIG. 6A, the hole pattern 650 of the photoresist layer 605 was transferred to the intermediate mask layer 604.

(Photoresist Layer Removal Step)

Figure 6B:
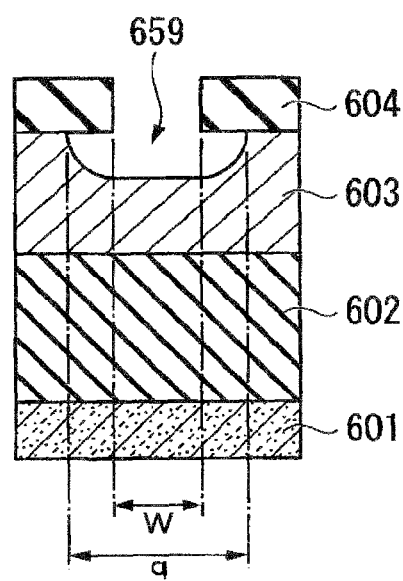

Next, ashing removal of the photoresist layer 605 was performed. However, when performing ashing removal of the photoresist layer 605, the exposed portion of the carbon film layer 603 was etched via the hole pattern 650 that was formed in the intermediate mask layer 604. As a result, as shown in FIG. 6B, a hole pattern 659 with a width q (q>W) was formed in the carbon film layer 603, and so it was not possible to form a hole pattern with a narrower width than the hole pattern formed with the lithography method.

The embodiments of the present invention are methods that form a fine hole pattern with high precision and good productivity, and, in particular, are methods of forming a hole pattern with a width of 60 nm or less with high precision and good productivity. Thereby, they can be utilized in the industry of manufacturing semiconductor devices at are provided with a fine hole pattern.

It is apparent that the present invention is not limited to the above embodiments, but may be modified and changed without departing from the scope and spirit of the invention.

What is claimed is:

1. A hole pattern forming method that forms a fine hole pattern in a work target layer that is formed on a semiconductor substrate, comprising:

forming a three-layer structure by laminating a carbon film layer, an intermediate mask layer, and a photoresist layer in that order on the work target layer;

after patterning a hole pattern in the photoresist layer, patterning the hole pattern in the intermediate mask layer with the patterned photoresist layer serving as a mask;

forming a sidewall oxide film on exposed portions of the photoresist layer, the intermediate mask layer, and the carbon film layer;

forming a sidewall portion that includes the sidewall oxide film on inner wall surfaces of the hole pattern by etching back the sidewall oxide film; and after patterning a fine hole pattern in the carbon film layer with the sidewall portion and the intermediate mask layer serving as a mask, patterning the fine hole pattern in the work target layer with the patterned carbon film layer serving as a mask.

2. The hole pattern forming method according to claim 1, wherein the sidewall oxide film is formed in an atmosphere below a softening temperature of the photoresist layer.

3. The hole pattern forming method according to claim 1, wherein the sidewall oxide film is formed using an ALD method.

4. The hole pattern forming method according to claim 1, wherein the carbon film layer includes amorphous carbon.

5. The hole pattern forming method according to claim 1, wherein the sidewall oxide film is an oxide film that includes a cross-linked silica.

6. A semiconductor device manufacturing method comprising manufacturing a semiconductor device using the hole pattern forming method according to claim 1.

* * * * *